United States Patent
Kuwabara et al.

(10) Patent No.: US 7,037,752 B2
(45) Date of Patent: May 2, 2006

(54) SEMICONDUCTOR DEVICE AND MANUFACTURING METHOD THEREOF

(75) Inventors: Hideaki Kuwabara, Isehara (JP); Toru Takayama, Atsugi (JP); Yuugo Goto, Atsugi (JP); Junya Maruyama, Ebina (JP); Yumiko Ohno, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/740,422

(22) Filed: Dec. 22, 2003

(65) Prior Publication Data

US 2004/0130020 A1   Jul. 8, 2004

(30) Foreign Application Priority Data

Dec. 27, 2002   (JP) ............................... 2002-380969

(51) Int. Cl.
 *H01L 21/44* (2006.01)
(52) U.S. Cl. .................... 438/107; 438/149; 438/166
(58) Field of Classification Search ............... 438/15, 438/25–26, 55, 64, 106–110, 118, 128, 149, 438/152, 155, 164, 166, 455, 458–459, 597–599, 438/602–606, 608, 618, 621, 628, 644, 654, 438/667, 761, 660–663, 795–796, 977, 798
See application file for complete search history.

(56) References Cited

U.S. PATENT DOCUMENTS

| | | | |
|---|---|---|---|
| 5,614,766 A | | 3/1997 | Takasu et al. |
| 5,821,138 A | * | 10/1998 | Yamazaki et al. .......... 438/166 |
| 5,874,784 A | | 2/1999 | Aoki et al. |
| 5,877,533 A | | 3/1999 | Arai et al. |
| 6,410,960 B1 | | 6/2002 | Arai et al. |
| 6,503,778 B1 | * | 1/2003 | Yamauchi et al. .......... 438/107 |
| 6,599,818 B1 | * | 7/2003 | Dairiki ...................... 438/486 |
| 2002/0028541 A1 | * | 3/2002 | Lee et al. ................... 438/149 |

FOREIGN PATENT DOCUMENTS

| | | |
|---|---|---|
| JP | 05-090486 | 4/1993 |
| JP | 09-121002 | 5/1997 |

* cited by examiner

*Primary Examiner*—Michael Lebentritt
*Assistant Examiner*—Andre' Stevenson
(74) *Attorney, Agent, or Firm*—Eric J. Robinson; Robinson Intellectual Property Law Office, P.C.

(57) ABSTRACT

A technique for manufacturing a low-cost, small volume, and highly integrated semiconductor device is provided. A characteristic of the present invention is that a semiconductor element formed by using a semiconductor thin film is transferred over a semiconductor element formed by using a semiconductor substrate by a transfer technique in order to manufacture a semiconductor device. Compared with the conventional manufacturing method, mass production of semiconductor devices with lower cost and higher throughput can be realized, and production cost per semiconductor device can be reduced.

22 Claims, 9 Drawing Sheets

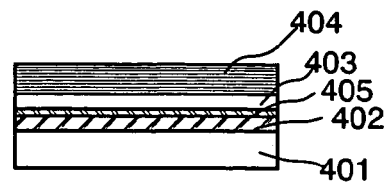
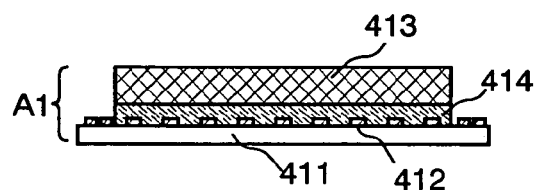
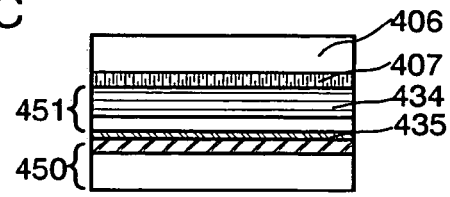
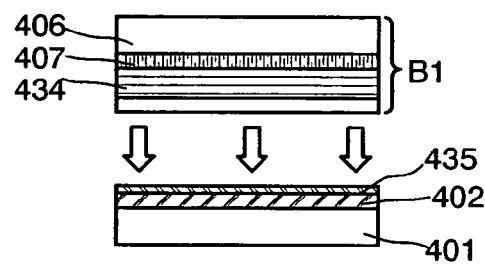
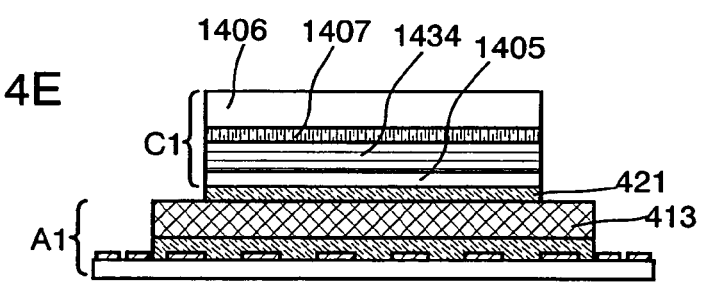
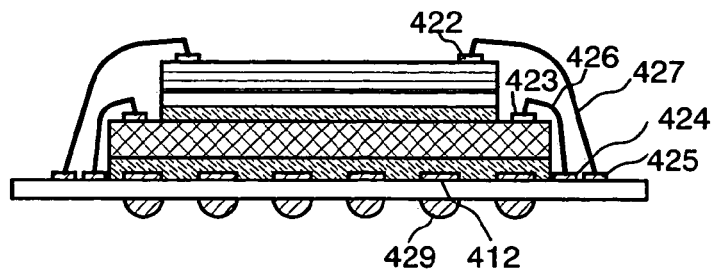

SEMICONDUCTOR DEVICE AND MANUFACTURING METHOD THEREOF

BACKGROUND OF THE INVENTION

1. Field of the Invention

The present invention relates to a highly integrated semiconductor device and a manufacturing method thereof. In particular, the present invention relates to a semiconductor device on which a semiconductor element with integrated circuit (IC chip) is mounted, and a manufacturing method thereof.

2. Description of the Related Art

A portable electric apparatus which is represented by a cellular phone or an electronic date book is required to have various kinds of functions such as E-mail, sound recognition, image loading by a small sized camera, and Internet. Therefore, a semiconductor device (a package) having larger circuit size and larger memory volume is required.

Meanwhile, a portable electric apparatus has become smaller sized, thinner, and lower cost. For this reason, a semiconductor device (package), passive components such as a resistor or the like, a mounted substrate, and the like are required to be small sized and low cost. And a semiconductor device which is miniaturized almost to the size of a chip, namely, a CSP (Chip Size Package) is developed. (Reference 1: JP 9-121002)

Therefore, there is a MCP (Multi Chip Package) in which an integrated circuit (IC chip) integrated by plural semiconductor substrates is mounted on a package to increase the integration of a semiconductor device. (Reference 2: JP 5-90486)

As a MCP, there is one that arranges integrated circuits (IC chips) laterally formed of several semiconductor substrates to increase the integration. Since the plural IC chips are arranged laterally, the area of the package becomes large, and thus, reduction in the size of a mounted substrate is prevented.

A semiconductor device (a package) disclosed in Reference 2 is formed of plural lamination of integrated circuits (IC chip) formed of a silicon wafer (a semiconductor substrate). Since the film thickness of the IC chip is comparatively thick, the lamination thereof causes increased volume of the package even if the area of the package is reduced. As a result, a thin electric apparatus using a package is prevented.

A process (back grinder) for thinly polishing an IC chip formed of a silicon wafer is adopted in order to control the volume of the package in MCP. However, the process is resulted to decline in mechanical strength of a semiconductor element because of leaving the polished mark of approximately 10 nm in the back surface of the silicon wafer. As a result, there is a problem of decline in yield caused by the polishing process of a semiconductor element.

Further, since a silicon wafer is more expensive compared to the cost of a glass substrate, there is a problem that plural lamination of semiconductor elements using the silicon wafer causes high price per one package.

SUMMARY OF THE INVENTION

Based on the above problems, it is an object of the present invention to manufacture a semiconductor device which is low cost, small volume, and highly integrated.

According to the present invention, a characteristic of a method for manufacturing a semiconductor device is described as below:

a method for manufacturing a semiconductor device in which a wiring portion, a first semiconductor element, and a second semiconductor element are laminated on an insulating substrate in sequence, comprising the steps of:

forming an integrated circuit of the first semiconductor element using a semiconductor substrate;

bonding the first semiconductor element to the insulating substrate through the wiring portion;

laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding the second semiconductor element over the first semiconductor element;

removing the first adhesive member;

separating the second substrate from the second semiconductor element;

electrically connecting the second semiconductor element to the wiring portion after electrically connecting the first semiconductor element to the wiring portion.

According to the present invention, a characteristic of a method for manufacturing a semiconductor device is also described as below:

a method for manufacturing a semiconductor device in which a wiring portion, a first semiconductor element, and a second semiconductor element are laminated on an insulating substrate in sequence, comprising the steps of:

forming an integrated circuit of the first semiconductor element using a semiconductor substrate;

electrically connecting the wiring portion and the first semiconductor element which are formed over the insulating substrate;

laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding the second semiconductor element over the first semiconductor element;

removing the first adhesive member;

separating the second substrate from the second semiconductor element;

electrically connecting the second semiconductor element to the wiring portion.

According to the present invention, a characteristic of a method for manufacturing a semiconductor device is further described as below:

a method for manufacturing a semiconductor device in which a first wiring portion, a first semiconductor element, a second wiring portion, and a second semiconductor element are laminated on an insulating substrate in sequence, comprising the steps of:

forming an integrated circuit of the first semiconductor element by using a semiconductor substrate;

forming a second wiring portion over the first semiconductor element through an insulating film after electrically connecting the first wiring portion and the first semiconductor element which are formed over the insulating substrate;

laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding a third substrate to the second semiconductor element so as to face the second substrate;

removing the first adhesive member;

separating the second substrate from the second semiconductor element;

electrically connecting the second wiring portion and the second semiconductor element.

According to the present invention, a characteristic of a method for manufacturing a semiconductor device is further described as below:

a method for manufacturing a semiconductor device in which a wiring portion, a second semiconductor element, and a first semiconductor element are laminated over an insulating substrate in sequence, comprising the steps of:

forming a integrated circuit of the first semiconductor element by using a semiconductor substrate, laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding the second semiconductor element over the first semiconductor element;

removing the first adhesive member;

separating the second substrate from the second semiconductor element;

bonding the second semiconductor element to the insulating substrate through the wiring portion;

electrically connecting the first semiconductor element and the wiring portion after electrically connecting the second semiconductor element and the wiring portion.

According to the present invention, a characteristic of a method for manufacturing a semiconductor device is furthermore described as below:

a method for manufacturing a semiconductor device in which a wiring portion, a second semiconductor element, and a first semiconductor element are laminated over an insulating substrate in sequence, comprising the steps of:

forming an integrated circuit of the first semiconductor element using a semiconductor substrate, laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding the second semiconductor element over the first semiconductor element;

removing the first adhesive member;

separating the second substrate from the second semiconductor element;

electrically connecting the wiring portion and the second semiconductor element which are formed over the insulating substrate;

electrically connecting the first semiconductor element and the wiring portion.

According to the present invention, a characteristic of a method for manufacturing a semiconductor device is moreover described as below:

a method for manufacturing a semiconductor device in which a first wiring portion, a second semiconductor element, a second wiring portion, and a first semiconductor element are laminated over an insulating substrate in sequence, comprising the steps of:

forming an integrated circuit of the first semiconductor element using a semiconductor substrate;

laminating a metal film, a metal oxide film, an insulating film, and a semiconductor thin film on a surface of a first substrate in sequence and crystallizing the metal oxide film and the semiconductor thin film by heat treatment, forming an integrated circuit of the second semiconductor element using the crystallized semiconductor thin film;

bonding a second substrate over the second semiconductor element with a first adhesive member so as to face the first substrate;

separating the metal film from the crystallized metal oxide film, the crystallized metal oxide film from the insulating film, or the crystallized metal oxide film by a physical means;

bonding a third substrate to the second semiconductor element so as to face the second substrate;

removing the first adhesive member;

separating the second substrate from the second semiconductor element;

forming a second wiring portion over the second semiconductor element through the third substrate after electrically connecting the first wiring portion and the second semiconductor element which are formed over the insulating substrate, electrically connecting the second wiring portion and the first semiconductor element.

The semiconductor substrate is either a single crystal silicon substrate or a compound semiconductor substrate, typically, an n-type or a p-type single crystal silicon substrate, a GaAs substrate, an InP substrate, a GaN substrate, a SiC substrate, a ZnSe substrate, a GaP substrate, or an InSb substrate.

In addition, the semiconductor thin film is a thin film comprising silicon.

The first semiconductor element of the present invention comprises a power supply circuit, a transmitter-receiver circuit, a memory, or an amplifier of a sound processing circuit, and the second semiconductor element comprises a scanning line driver circuit of a pixel portion, a signal line driver circuit, a controller, a CPU, or a converter of a sound processing circuit.

Further, the first adhesive member is a peelable adhesive.

The insulating substrate comprises a material selected from the group consisting of polyimide, alumina, ceramics, or glass epoxy resin.

A semiconductor element wherein an integrated circuit is formed by using a semiconductor substrate and a semiconductor element in which an integrated circuit is formed by using a semiconductor thin film are laminated over an insulating substrate through an organic resin or an adhesive member in a semiconductor device manufactured in the present invention.

A semiconductor element in which an integrated circuit is formed by using the semiconductor substrate is interposed between a semiconductor element in which an integrated circuit is formed by using the semiconductor thin film and the insulating substrate.

A semiconductor element in which an integrated circuit is formed by using the semiconductor thin film is interposed between a semiconductor element in which an integrated circuit is formed by using the semiconductor substrate and the insulating substrate.

The film thickness of a semiconductor element in which an integrated circuit is formed by using the semiconductor thin film is 50 μm or less, preferably, between 0.1 μm and 1 μm.

According to the present invention, the number of integrated circuits formed of semiconductor substrates per a semiconductor device; typically, the number of single crystal silicon ICs can be reduced. Thus, mass production of semiconductor devices with lower cost and higher throughput than those in the conventional MCP can be realized, and production cost per a semiconductor device can be reduced.

More semiconductor devices having a larger circuit size and memory capacity can be equipped within limited volume of an electric apparatus. Also, a semiconductor device can be made small sized and lightweight while realizing multifunction of an electric apparatus. It is important to be small sized and lightweight for portable electric apparatuses, therefore, it is effective to use a semiconductor device of the present invention.

A semiconductor device of the presents invention can be utilized further for various circuits to control the drive of: liquid crystal display devices; light emitting display devices provided with a light emitting element which is represented by an organic light emitting element in each pixel; and display devices such as DMD (Digital Micromirror Device), PDP (Plasma Display Panel), FED (Field Emission Display).

For example, in the case of an active matrix type liquid crystal display device or a light emitting device, a TFT is used to manufacture a scanning line driver circuit for selecting each pixel, a signal line driver circuit for controlling the timing for supplying a video signal to the selected pixel, a controller for generating a signal to supplying to a scanning line driver circuit and a signal line driver circuit, a converter for a sound processing circuit or the like, then each of which is provided over a circuit (typically, a power supply circuit, a transmitter-receiver circuit, a memory, an amplifier of a sound processing circuit, or the like) which is preferable for forming by using a semiconductor substrate such as a silicon wafer, to make a laminated structure of a semiconductor device.

In addition, an electric. apparatus of the present invention is not limited to the above described display device, but includes a video camera, a digital camera, a goggles-type display (head mount display), a navigation system, a sound reproduction device (such as an in-car audio system, an audio set and the like), a personal computer, a game machine, a portable information terminal (such as a mobile computer, a cellular phone, a portable game machine, and an electronic book and the like), an image reproduction device including a recording medium (more specifically, a device which can reproduce a recording medium such as a digital versatile disc (DVD) and display the reproduced image), and the like. In particular, the present invention is effective to apply to portable electric apparatuses which are represented by a laptop personal computer, a portable video camera, a portable digital camera, a goggles-type display (head mount display), and a portable information terminal (such as a mobile computer, a cellular phone, a portable game machine, and an electronic book)

BRIEF DESCRIPTION OF THE DRAWINGS

FIGS. 4A to 4F are diagrams showing Embodiment Mode 1 of the present invention;

DETAILED DESCRIPTION OF THE PREFERRED EMBODIMENTS

[Embodiment Mode]

Figure 1:
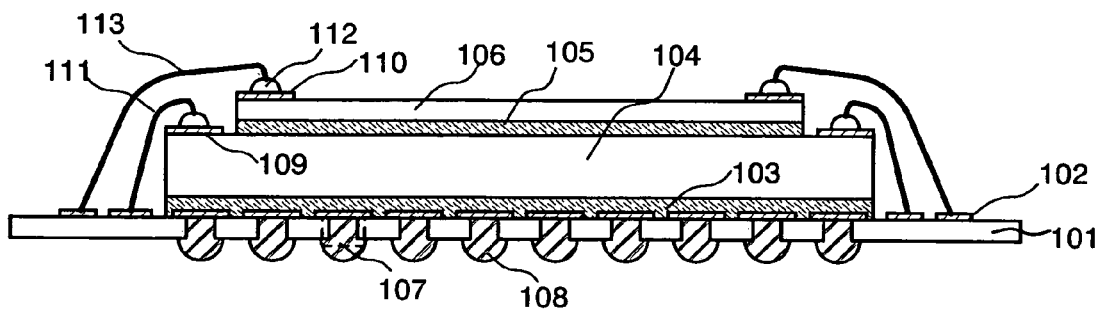
FIG. 1 is a cross sectional view of a semiconductor device according to the present invention.

Embodiment modes of the present invention are hereinafter described with reference to the drawings. However, it is easily understood by those skilled in the art that the present invention can be performed with variety of modes, and can be freely changed the modes and the details without any departure from the purpose and the scope of the invention. Therefore, the invention should not be interpreted limiting to the description of the following embodiment modes.

[Embodiment Mode 1]

In the present embodiment mode, a semiconductor device of the present invention is described with reference to FIG. 1. FIG. 1A shows a cross sectional view of a semiconductor device in the present invention. A semiconductor element 104 in which an integrated circuit is formed by using a semiconductor substrate is provided over an insulating substrate (interposer) 101 through a wiring layer 102 and an adhesive layer 103 such as a thermo-compression bonding sheet. A semiconductor element 106 in which an integrated circuit is formed by using a semiconductor thin film is provided over the semiconductor element 104 through an adhesive layer 105 such as a thermo-compression bonding sheet. A through-hole 107 is formed in the insulating substrate, and a wiring layer 102 and an exterior terminal 108 such as a solder ball and the like are connected through the through-hole 107.

A known material such as polyimide substrate, an alumina substrate, a ceramics substrate, a glass epoxy substrate or the like can be used as the insulating substrate 101. Preferably, a material having higher thermal conductivity of approximately from 2 to 30 W/mK is used for diffusing the heat generated in the laminated integrated circuits.

In addition, electrode pads 109 and 110 are formed on the surface of the semiconductor elements. The electrodes pads 109 and 110, and the terminals of the wiring portions 102 are connected by wirings 111 and 113, respectively. The electrode pads comprise aluminum or aluminum alloy.

Figure 2:
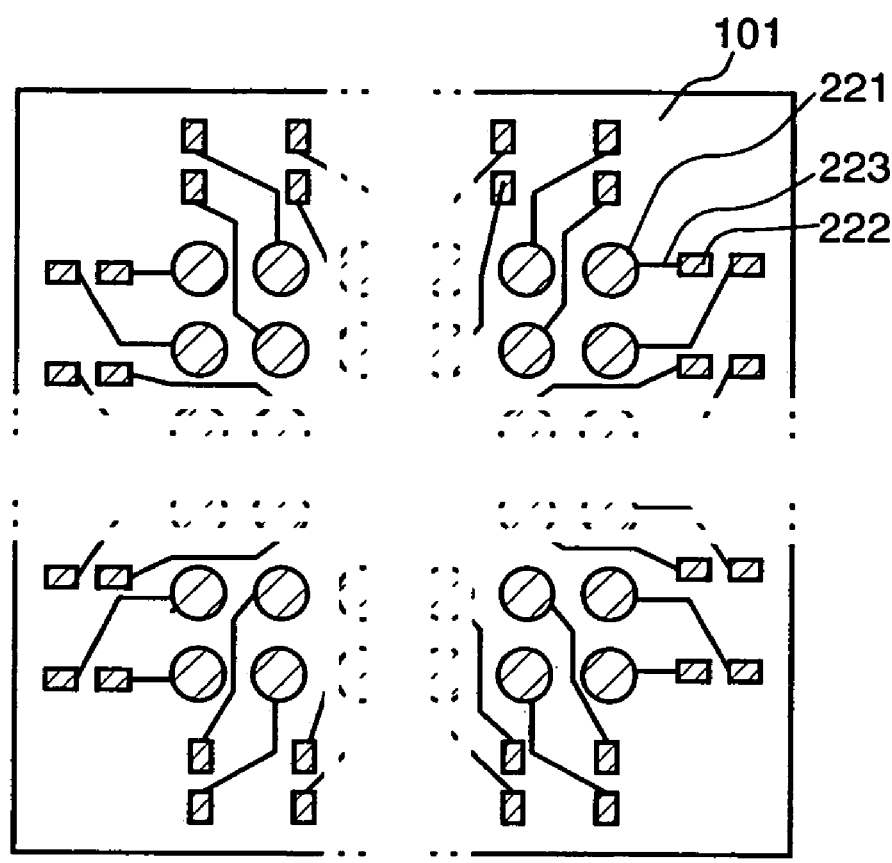
FIG. 2 is a diagram showing a wiring portion of the present invention.

FIG. 2 shows a top view of a wiring portion 102. The wiring portion 102 includes a metal pad 221 over the insulating substrate 101 in order to be connected with an exterior terminal, and a terminal 222 connected with electrodes pads on the semiconductor element (109 and 110 in FIG. 1) and wirings (111 and 113 in FIG. 1) are connected with a wiring 223. It is noted that a thin film formed of copper, gold, aluminum, nickel, tin, or the like is etched to have a desired shape and formed to be the wiring portion. The electrode pad of the semiconductor element and the terminal of the wiring portion are connected by a wire bonding method using a thermo-compression bonding method or an ultrasonic bonding method. The wiring is to be a thin line of metal comprises gold, alloy including gold, cupper, or alloy including cupper. The exterior terminal is to be a terminal for connecting the wiring of a mounted substrate to the wiring portion of a semiconductor device, namely, to a semiconductor element.

A semiconductor element 104 in which an integrated circuit is formed by using a semiconductor substrate is formed by as below: forming an element such as a field-effect transistor (FET), a bipolar transistor, a memory element, a diode, a photoelectric transfer element, a resistor element, a coil, a capacity element, an inductor, or the like; and forming an integrated circuit by using those above-mentioned elements. A single crystal silicon substrate is typified by an n-type or a p-type single crystal silicon substrate ((100) substrate, (110) substrate, (111) substrate, or the like). Also, a compound semiconductor substrate is typified by a GaAs substrate, InP substrate, GaN substrate for GaN system epitaxis, SiC substrate, ZnSe substrate, GaP substrate, InSb substrate. A semiconductor element forming integrated circuits by using a semiconductor substrate includes, as typical example, a power supply circuit, a transmitter-receiver circuit, a memory, or an amplifier of a sound processing circuit.

A semiconductor element 106 in which an integrated circuit is formed by using a semiconductor thin film includes an integrated circuit by using a polysilicon film. Concretely, the integrated circuit is formed by using a thin film transistor (TFT), a memory element, a diode, a photoelectric transfer element, a resistor element, a coil, a capacity element, an inductor, or the like. Also, a semiconductor element in which an integrated circuit is formed by using a semiconductor thin film includes, in the case of a display device, a scanning line driver circuit for selecting each pixel, a signal line driver circuit for controlling the timing for supplying a video signal to the selected pixel, a controller, a CPU, or a converter for a sound processing circuit.

Figure 9:
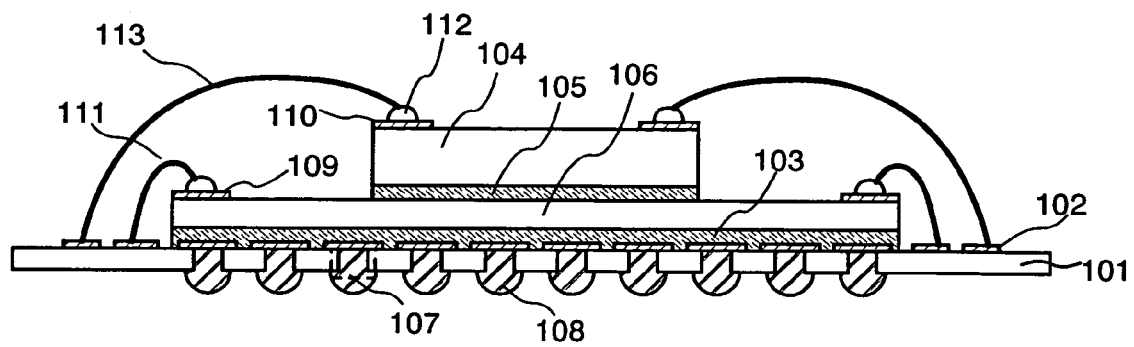
FIGS. 9 is a cross sectional view of a semiconductor device of the present invention.

Further, as shown in FIG. 9, a semiconductor element 106 in which an integrated circuit is formed by using a semiconductor thin film may be provided over an insulating substrate (interposer) 101 through a wiring layer 102 and an adhesive layer 103 such as a thermo-compression bonding sheet. And a semiconductor element 104 in which an integrated circuit is formed by using a semiconductor substrate may be provided over the semiconductor element 106 through an adhesive layer 105 such as a thermo-compression bonding sheet.

Note that a semiconductor device in the present invention has a laminated structure of two layered semiconductor elements, however, the structure is not limited hereto. The semiconductor device may have a laminated structure of plural semiconductor elements 104 formed by using a semiconductor substrates and plural semiconductor elements 106 formed by using a semiconductor thin films.

In FIG. 1, plural semiconductor elements are connected to wiring portions (terminals) each provided over an insulating substrate through wirings, however, each semiconductor element may be connected to one another using wirings.

[Embodiment Mode 2]

In the present embodiment mode, a method for manufacturing a semiconductor device which is shown in Embodiment Mode 1 is described. A semiconductor device of the present embodiment mode has a face up mode for all the semiconductor elements.

First, a method for manufacturing a semiconductor element (a first semiconductor element) in which an integrated circuit is formed by using a semiconductor substrate is shown in FIG. 4A. After forming a wiring portion 412 on an insulating substrate 411, the semiconductor element (the first semiconductor element) 413 in which an integrated circuit is formed by using a semiconductor substrate is bonded with an adhesive layer 414 such as a thermo-compression bonding sheet. A through-hole (107 in FIG. 1A) for connecting an exterior terminal and a semiconductor element is formed in the insulating substrate 411. The exterior terminal serves to electrically connect wirings in a mounted substrate and semiconductor elements. An insulating substrate 411, a wiring portion 412, and the semiconductor element 413 comprises single crystal silicon fixed with the adhesive member 414 are indicated as A1.

Next, a method for manufacturing a semiconductor element (a second semiconductor element) in which an integrated circuit is formed by using a semiconductor thin film is shown in FIGS. 4B to 4D. First, a metal layer 402 is formed over a substrate 401 as shown in FIG. 4B. An example of a metal layer 402 includes a single layer containing an element selected from the group consisting of W, Ti, Ta, Mo, Cr, Nd, Fe, Ni, Co, Zr, Zn, Ru, Rh, Pd, Os, and Ir, or an alloy material or a compound material which mainly contains the element, or a laminate of those. In addition, a single layer containing nitride of the element, for example, titanium nitride, tungsten nitride, tantalum nitride, or molybdenum nitride, or a laminate of those may be used. The condition of the subsequent peeling process differs by properly controlling the composition ratio of the alloy in the metal layer or the composition ratio of oxygen or nitrogen contained in the metal layer. Therefore, the peeling process becomes possible to be adjusted to the various processes. The film thickness of a nitride or a metal layer 402 is set from 10 nm to 200 nm, preferably, from 50 nm to 75 nm.

An oxide layer 403 is formed over a metal or a nitride layer 402. A metal oxide film (tungstic oxide film) 405, which is in amorphous state, with a thickness of approximately from 2 nm to 5 nm is formed between the metal or a nitride layer 402 and the oxide layer 403. When peeling in the later process, separation arises in the metal oxide film, at the interface between the metal oxide film and the oxide film, or at the interface between the metal oxide film and the metal film. A layer containing silicon oxide, silicon oxynitride, and a metal oxide material may be used to form an oxide layer 403 by sputtering. The film thickness of the oxide layer 403 is preferably about equal to or more than twice the film thickness of the nitride or metal layer 402. Here, the film thickness of silicon oxide film is set to from 150 nm to 200 nm by sputtering using an oxidized silicon oxide target.

Next, a layer including hydrogen is formed over the oxide layer 403. A semiconductor layer, a nitride layer or the like can be adapted to the layer including hydrogen. A first semiconductor layer 404 is formed as a layer including hydrogen in the present embodiment. Then, heat treatment is performed to diffuse hydrogen contained in the layer including hydrogen. The process may be performed separately from one in the formation process of a crystalline semiconductor film, or omitted by combination thereof. For example, in the case of using an amorphous silicon film including hydrogen as a film including hydrogen in order to form a polysilicon film by using heating, heat treatment at equal to or more than 500° C. for crystallization enables to form a polysilicon film and to diffuse hydrogen at the same time. At this point, an amorphous metal oxide layer 405 formed between the metal layer 402 and the oxide layer 403 is to be a crystalline metal oxide film 435.

As shown in FIG. 4C, the first semiconductor layer 404 is etched to have a desired shape by a known technique to form a second semiconductor layer 434. The second semiconductor layer is formed of a TFT (not shown). The film thickness of the second semiconductor layer 434 at this point is equal to or less than 50 μm, preferably, from 0.1 to 1 μm.

A second substrate 406 which serves as a support medium for fixing the second semiconductor layer 434 is sealed with a peelable adhesive 407. A substrate having higher rigidity than that of the first substrate 401, which is represented by a quartz substrate, a metal substrate, or a ceramics substrate is preferable used for the second substrate 406. The adhesive comprising an organic material is used for the peelable adhesive 407. The adhesive comprising an organic material includes various kinds of peelable adhesives such as a reactive peelable adhesive, a thermally-peelable adhesive, a photo peelable adhesive such as an UV peelable adhesive, and an anaerobic peelable adhesive. In addition, a member having an adhesive layer comprising a peelable adhesive on both sides (typically, two-sided tape or two-sided sheet) may be used.

In FIG. 4C, the first substrate 401 and the metal layer 402 mounted over the first substrate 401 is termed a separation body 450. In addition, the oxide layer 403 to the second semiconductor layer 434 (namely, a layer sandwiched between the metal layer 402 and the peelable adhesive 407 for fixing the second substrate 406) are termed a released body 451.

Then, as shown in FIG. 4D, the separation body 450 and the released body 451 are separated from each other by a physical means. Separation is generated in a metal oxide layer 435, between an oxide layer 403 and a metal oxide layer 435, or between a metal oxide layer 435 and a metal layer 402, thus, the separation body 450 and the released body 451 can be separated with relatively small force.

The released body 451 can be thus separated from the separation body 450. Here, the released body 451 and the second substrate 406 fixed with the peelable adhesive 407 are shown as B1. Next, the second substrate and the released layer B1 fixed thereon are divided to form a released body (C1) into a chip shape. The chip shape released body comprises a second semiconductor element. The second semiconductor element 1434 is formed by dividing the second semiconductor layer 434. Also, the second semiconductor element 1434 is fixed over the divided second substrate (hereinafter, referred to as a third substrate 1406) with an adhesive 1407. In addition, an oxide layer 1403 (which is formed by dividing the oxide layer 403) is formed in the opposite side of the adhesive 1407.

As shown in FIG. 4E, the chip shape released body B1 is fixed over A1 in FIG. 4A. In particular, the second semiconductor element 1434, namely, an oxide layer 403 forming the second semiconductor element is bonded to the surface of the first semiconductor element 413 formed over the insulating substrate 411 by using an adhesive member 421. Note that radiation heat is increased by bonding the oxide layer 403 while sandwiching a material having higher thermal conductivity between the oxide layer 403 and the adhesive member 421 through a material having high thermal conductivity.

It is important that the adhesive member 421 for bonding the released body 451 and the first semiconductor element 413 is formed of a material which has higher adhesion than the peelable adhesive 1407 for bonding the third substrate 1406 and the released body 451. Various kinds of curable adhesive member s such as a reactive-cured adhesive member, a thermosetting curable adhesive member, a photocurable adhesive member such as an UV-curable adhesive member, or an anaerobic curable adhesive member can be used for the adhesive member 421. In addition, a member having an adhesive layer containing a peelable adhesive on both sides (typically, two-sided tape or two-sided sheet) may be used As shown in FIG. 4F, the third substrate 1406 which serves as a support medium and the peelable adhesive 1407 are separated from the second semiconductor element 1434. The peelable adhesive 1407 containing organic materials is reacted with heat, light, humidity, or chemically (For example, with water, oxygen, or the like) so that the third substrate 1406 and the peelable adhesive 1407 containing organic materials are separated from the second semiconductor element 1434.

Subsequently, electrode pads 422 and 423 of each semiconductor element, and terminals 424 and 425 of a wiring portion are connected with wirings 426 and 427. First, the electrode pad 423 on the first semiconductor element and the terminal 424 of the wiring portion are connected by a wire bonding method and subsequently, the electrode pad 422 on the second semiconductor element and the terminal 425 of the wiring portion are connected in the similar process.

Then, the semiconductor elements and the wirings may be sealed by a hermetic sealing method or a plastic molding method. When using the hermetic sealing method, a case generally comprising ceramics, metal, or glass is used to perform the sealing. When using the plastic molding method, in concrete terms, mold plastic, or the like is used. In the present embodiment mode, the second semiconductor element and wirings are not always to be sealed since the second semiconductor element also serves as a protective layer of the first semiconductor element. However, performing the sealing, a mechanical strength of the semiconductor device can be improved, and an electromagnetic noise from neighboring circuits can be shut out. Subsequently, a terminal of the wiring portion 412 and an exterior terminal 429 are connected with each other in the through-hole of the insulating substrate.

According to the above-mentioned process, a semiconductor device wherein a semiconductor element in which an integrated circuit is formed by using a semiconductor substrate typified by a single crystal silicon substrate, and a semiconductor element in which an integrated circuit is formed by using a semiconductor thin film typified by an polysilicon thin film are laminated can be manufactured.

It is noted that a further highly integrated semiconductor device can be manufactured by even laminating a third and a fourth semiconductor elements over the second semiconductor element by using the similar process as described above.

In addition, a transfer process in which the second semiconductor element is transferred to the first semiconductor element is not limited to the above-described process, and other processes can be applied.

A semiconductor device manufactured in the present embodiment mode is the one in which semiconductor elements are laminated, and a part of the semiconductor element is formed of a semiconductor thin film, therefore, characteristics of a highly integrated and small volume semiconductor device is revealed.

Further, the number of semiconductor elements in which an integrated circuit is formed by using semiconductor substrates, typically, the number of single crystal silicon ICs, per a semiconductor device can be reduced. Thus, mass production of semiconductor devices with lower cost and higher throughput can be realized as compared with the conventional MCP, and production cost per semiconductor device can be reduced.

[Embodiment Mode 3]

In the present embodiment mode, a semiconductor device having a different structure from Embodiment Modes 1 and 2 is described. In the present embodiment mode, a point that a first semiconductor element has a flip chip mode (face down mode) is different form that of Embodiment Mode 2.

In FIGS. 5A to 5D show cross sectional views of a semiconductor device in the present embodiment mode. A wiring portion 502 over an insulating substrate 501 and an electrode pad 504 of a first semiconductor element 503 containing a semiconductor substrate are connected with a connection terminal 505 such as a bump. Note that the first semiconductor element 503, the insulating substrate 501, and the wiring portion 502 formed over the insulating substrate are fixed with a resin and the like 506. Further, the insulating substrate 501 includes a through-hole (not shown) for connecting an exterior terminal and a semiconductor element; the wiring portion 502 and the exterior terminal are connected in the through-hole. The exterior terminal is connected to the wiring of the mounted substrate. The insulating substrate 501, the wiring portion 502, the electrode pad 504 of the first semiconductor element 503, the bump 505, a resin 506 for fixing those, and the like are indicated as A2.

In the similar process as Embodiment Mode 2, a second semiconductor element 1434 including a semiconductor thin film fixed by a third substrate 1406 shown in FIG. 4E is formed. The film thickness of the semiconductor thin film of the second semiconductor element 1434 is equal to or less than 50 µm, preferably, from 0.1 nm to 1 µm. A peelable adhesive 1407 is used to fix the third substrate 1406 and the second semiconductor element 1434 including a semiconductor thin film. (The third substrate and the second semiconductor element fixed to the third substrate are indicated as C1.) (FIG. 5B)

Figure 5A:
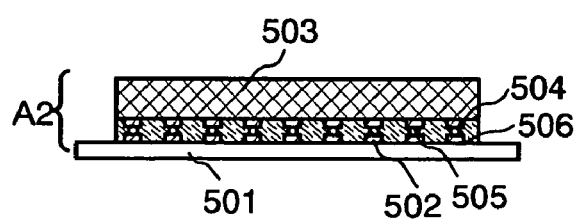
FIGS. 5A to 5D are diagrams showing Embodiment Mode 2 of the present invention.
Figure 5B:
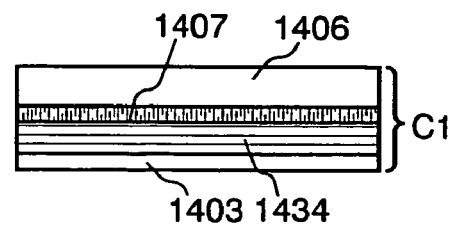
Figure 5C:
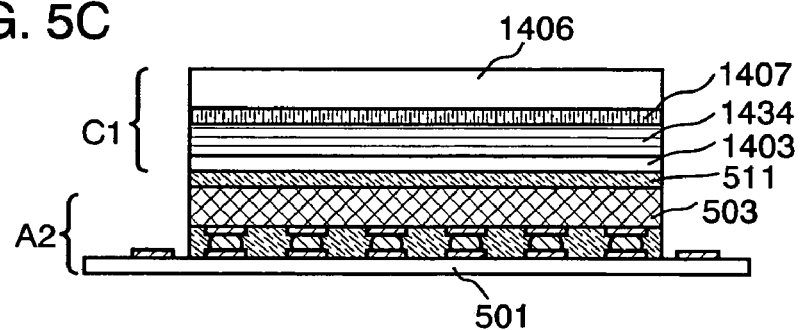

Then, C1 in FIG. 5B is fixed over A2 in FIG. 5A by using an adhesive member 511. In specific, an oxide film layer 1403 in which the second semiconductor element is formed is bonded to the surface of the first semiconductor element 503 formed over the insulating substrate 501 by using the adhesive member 511. Note that radiation heat is increased by performing the bonding while sandwiching a material having higher thermal conductivity between the oxide layer 1403 and the adhesive member 511. After this, the third substrate 1406 which serves as a support medium and the peelable adhesive 1407 are separated from the second semiconductor element 1434 using the similar technique of Embodiment Mode 1. (FIG. 5C)

Figure 5D:
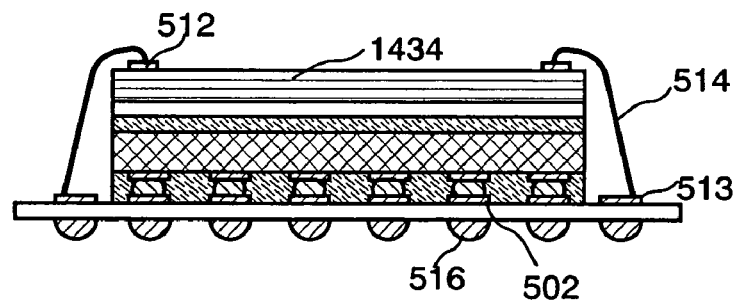

As shown in FIG. 5D, an electrode pad 512 of the second semiconductor element 1434 and a terminal 513 of the wiring portion 502 are connected with a wiring 514. Afterward, integrated circuits 434 and 503 laminated over the insulating substrate 501 and the wiring 514 may be sealed by using the similar technique of Embodiment Mode 2. Then, the electrode pad of the wiring portion 502 and the exterior terminal 516 are connected in the through-hole of the insulating substrate 501.

According to the above-mentioned process, a semiconductor device wherein a semiconductor element in which an integrated circuit is formed by using a semiconductor substrate typified by a single crystal silicon substrate, and a semiconductor element in which an integrated circuit is formed by using a semiconductor thin film typified by an polysilicon thin film are laminated can be manufactured.

A semiconductor device manufactured according to the present embodiment mode is the one in which an integrated circuit is laminated, and a part of the semiconductor element is formed by using a semiconductor thin film, therefore, characteristics of a highly integrated and small volume semiconductor device is revealed.

Further, the number of semiconductor elements in which an integrated circuit formed by using semiconductor substrates, typically, the number of single crystal silicon ICs, per a semiconductor device can be reduced compared to the conventional MCP. Thus, mass production of semiconductor devices with lower cost and higher throughput can be realized, and production cost per semiconductor device can be reduced.

Moreover, the integrated circuits manufactured of the semiconductor substrate has a flip chip mode, the number of wirings for connecting an electrode pad of an integrated circuit and a terminal of a wiring portion can be reduced. Thus, a semiconductor device with smaller volume can be realized.

[Embodiment Mode 4]

In the present embodiment mode, a method for manufacturing a semiconductor device having a different structure from those of Embodiment Modes 1 to 3 is described. The present embodiment mode is different from Embodiment Modes 2 and 3 in that all of the integrated circuits have a flip chip mode (face down mode).

A cross sectional view of a semiconductor device according to the present embodiment mode is shown in FIGS. 6A to 6G. A first semiconductor element forming integrated circuits by using a semiconductor substrate has a same structure (A2 in FIG. 5A) as the one in Embodiment Mode 3, and comprises an insulating substrate 501, a first wiring portion 502, an electrode pad 504 of a first semiconductor element 503, a bump 505, and a resin 506 for fixing those.

Figure 6A:
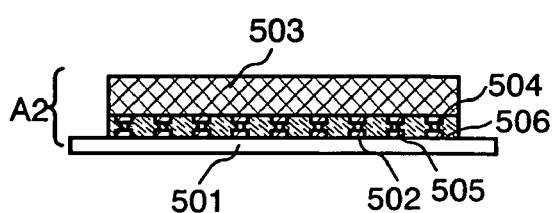
FIGS. 6A to 6G are diagrams showing Embodiment Mode 3 of the present invention.
Figure 6B:
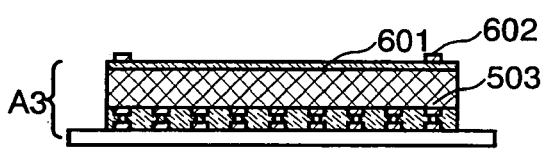

A second wiring portion 602 is formed over the first semiconductor element through an insulating layer 601 as shown in FIG. 6B.

A second semiconductor layer 434 in which an integrated circuit is formed by using a semiconductor thin film fixed over a second substrate 406 is formed in the similar process as Embodiment Mode 2. Note that the second substrate 406 and the second semiconductor layer 434 in which an integrated circuit is formed by using the semiconductor thin film are fixed with a peelable adhesive 407. (The second substrate and the second semiconductor element fixed thereto are indicated as B1) (FIG. 6C)

Figure 6C:
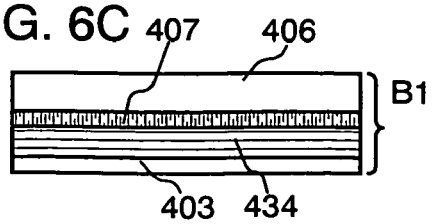
Figure 6D:
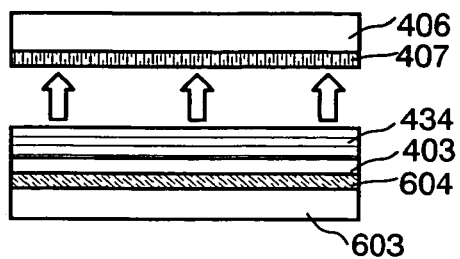

As shown in FIG. 6D, B1 in FIG. 6C is fixed over a fourth substrate 603 with an adhesive member 604. Specifically, an oxide film layer 403 forming the second semiconductor layer 434 is bonded to a fourth substrate 603 with the adhesive member 604. For the fourth substrate 603, glass, organic resin, metal, plastic, ceramics, or the like can be used. Volume of a semiconductor device can be reduced by using a thin substrate to the fourth substrate. Preferably, a member (film, substrate, or the like) having higher thermal conductivity such as DLC (diamond like carbon), copper, aluminum or the like is used as the fourth substrate, since heat radiation can be increased.

Figure 6E:
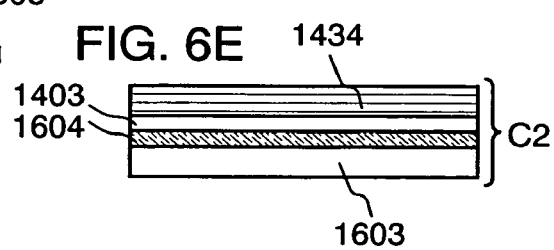

The second substrate 406 which serves as a supporting medium and the peelable adhesive 407 are separated from the second semiconductor layer 434. After that, the surface of an electrode wiring and the like which are exposed to the surface of the second integrated circuit are preferable cleaned by rinse or $O_2$ plasma treatment. Next, the fourth substrate is divided to form the semiconductor element into a chip shape. Here, the chip shaped fourth substrate (hereinafter referred to as a fifth substrate 1603), and a second semiconductor element 1434 which is transferred thereto are indicated as C2. In the second semiconductor element 1434, a oxide film layer 1403 formed over the second semiconductor element and a fifth substrate 1603 are fixed with a bonding layer 1604. (FIG. 6E)

Note that the oxide layer 1403 of the second semiconductor element 1434 is fixed to the fifth substrate 1603 via an adhesive 1604.

Figure 6F:
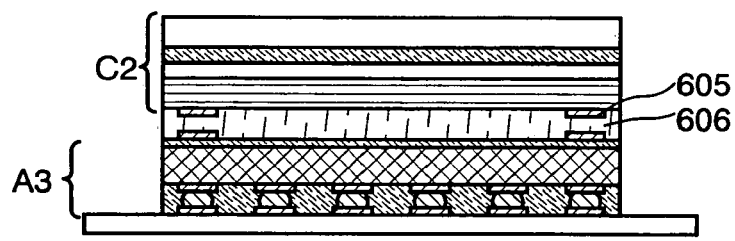

Next, as shown in FIG. 6F, the second semiconductor element C2 is bonded over the first semiconductor element A3. In specific, a second wiring portion 602 and an electrode pad 605 at the surface of the second semiconductor element are bonded together with an adhesive member or the like while performing alignment. In the present embodiment mode, the second wiring portion 602 formed over the surface of the first semiconductor element and the electrode pad 605 at the surface of the second semiconductor element are pressed with an Anisotropic Conductive Film (ACF) or Anisotropic Conductive Polymer (ACP) 606.

Figure 6G:
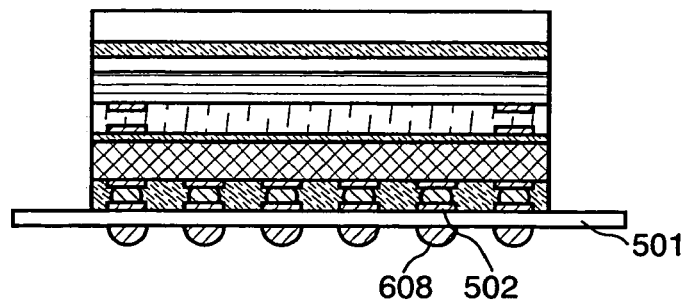

An electrode pad of the wiring portion 502 and an exterior terminal 608 are connected in a through-hole of the insulating substrate 501 as shown in FIG. 6G.

According to the above-mentioned processes, a semiconductor device wherein a semiconductor element in which an integrated circuit is formed by using a semiconductor substrate and a semiconductor element in which an integrated circuit is formed by using a semiconductor thin film are laminated can be manufactured.

A semiconductor device manufactured in the present embodiment mode is the one in which semiconductor elements are laminated, and a part of the semiconductor element is formed of a semiconductor thin film, therefore, characteristics of a highly integrated and small volume semiconductor device is revealed.

Further, the number of semiconductor elements in which an integrated circuit is formed by using semiconductor substrates per semiconductor device, typically, the number of the single crystal silicon ICs can be reduced. Thus, mass production of semiconductor devices at lower cost and with higher throughput can be realized as compared with the conventional MCP, and production cost per semiconductor device can be reduced.

Moreover, all semiconductor elements in the semiconductor device manufactured in the present embodiment mode have a flip chip mode without requiring a wiring for connecting an electrode pad of a semiconductor element to a terminal of a wiring portion; thus, a semiconductor device with smaller volume can be manufactured. In the case of using a member including an insulating material such as glass, organic resin, or ceramics as the third substrate, mold resin or the like are not required to be used for sealing since the surface of the semiconductor device is isolated. Therefore, semiconductor device having smaller volume can be manufactured.

EMBODIMENT

[Embodiment 1]

In this embodiment, a method for manufacturing a semiconductor device in which an integrated circuit (a first integrated circuit) formed of a single crystal silicon substrate according to the process of the Embodiment Mode 1 and an integrated circuit (a second integrated circuit) formed of a polysilicon thin film are laminated is described by using FIGS. 7A–7E and FIGS. 8A–8D.

Figure 7A:
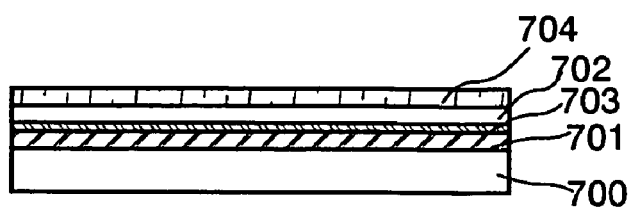
FIGS. 7A to 7E are diagrams showing Embodiment 1 of the present invention.

As shown in FIG. 7A, a metal film 701 here as a tungsten film having film thickness of 10 nm to 200 nm, preferably, 50 nm to 75 nm is deposited over a glass substrate (a first substrate 700) and then, an oxide film 702 here as silicon oxide film having film thickness of 150 nm to 200 nm is deposited thereover without exposing it to the air. At this occasion, a tungstic oxide film 703 of an amorphous state with a thickness of 2 nm to 5 nm is formed between the tungsten film 701 and the silicon oxide film 702. Since the end of the substrate are deposited by sputtering, preferably, the tungsten film and silicon oxide film which are deposited to the end of the substrate are selectively removed by $O_2$ ashing or the like. In the later process for peeling, separation arises at the interface between the tungsten film and the tungstic oxide film, in the tungstic oxide film, or at the interface between the tungstic oxide film and the silicon oxide film.

Instead of using a tungsten film, an alloy including tungsten such as W—Mo alloy can be used as the metal film 701. By controlling the composition ratio of the alloy in the metal layer, a peeling process can be properly changed. Further, the peeling can be performed easily by implanting nitride in the oxide film, or the peeling can be hardly performed by implanting oxygen in the oxide film by using an ion implantation method or an ion doping method.

Further, a silicon oxynitride (100 nm in thickness, not shown in the drawing) which serves as a base insulating film is formed by PCVD. Then, an amorphous silicon film 704 (54 nm in thickness) is laminated thereto without being exposed to the air.

Here, a polysilicon film is formed by using a known technique (solid-phase growth, laser crystallization, crystallization using a catalyst metal), and a polysilicon region having a desired shape is formed by patterning, then, TFTs (p-channel TFTs 705 and 708, and n-channel TFTs 706 and 707) that use the polysilicon region as an active region are formed. At this point, a gate insulating film is formed, a gate electrode is formed, and a source or a drain region is formed by doping into the active region, an interlayer insulating film is formed, and then, a source or a drain electrode is formed, respectively. Then, an activation is carried out.

Figure 7B:
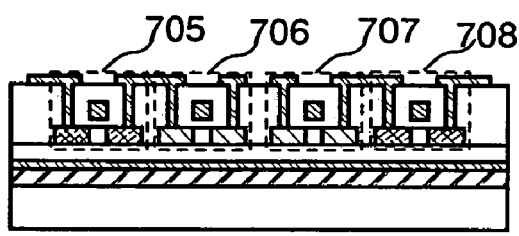

In this embodiment mode, a crystallization method using a catalyst metal is applied to the method for formation of a polysilicon film. In specific, a metal element, Ni is added to the amorphous silicon film and heated at 550° C. for 4 hours. The tungstic oxide film 703 is also crystallized by this process. The polysilicon film is irradiated with a continuous wave laser beam to enhance crystallization, and then, the polysilicon film is etched to the desired shape so as to align the channel length direction of a TFT and the scanning direction of the laser beam. A TFT using such a polysilicon film as the active region can obtain higher field effect mobility. In addition, the complementary combination of p-channel TFT 705 and n-channel TFT 706, and p-channel TFT 708 and n-channel TFT 707 constitutes a CMOS circuit. (FIG. 7B)

Figure 7C:
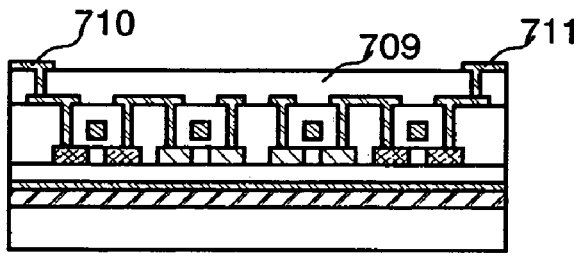

After the formation of an interlayer insulating film 709, contact holes are opened to form wirings 710 and 711 connected to TFT. The wirings 710 and 711 are each used for electrode pads. (FIG. 7C)

Figure 7D:
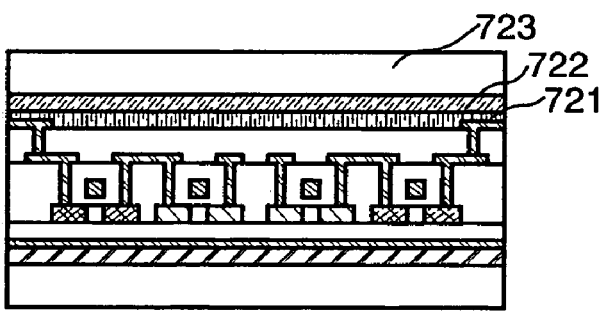

Next, as shown in FIG. 7D, an adhesive member 721 that is soluble in water or alcohol is coated over the whole surface of the interlayer insulating film 709 and the wirings 710 and 711 and baked. The adhesive member may be composed of, for example, epoxy series, acrylate series, silicon series, or the like. Here, a film with a thickness of 30 μm formed of water-soluble resin (TOAGOSEI Co., Ltd.: VL-WSHL10) 721 is spin-coated, and pre-cured, then, fully cured.

The next processing is for partially lowering the adhesion between the tungsten layer 701 and the silicon oxide layer 702. The processing for partially lowering the adhesion is the one in which the tungsten film 701 or the silicon oxide film 702 is partially irradiated with a laser beam along the perimeter of the region to be peeled off, or the one in which the tungstic oxide film 703 is locally pressurized externally along the perimeter of the region to be peeled off in order to damage a part of the inside of the silicon oxide layer 702 or a part of the interface. Specifically, a diamond pen or the like is used to depress a hard needle vertically and to apply load while moving. Preferably, a scriber apparatus is used and the depression amount is set to 1 mm to apply a pressure while moving. It is important to provide a portion that facilitates the peeling phenomenon, namely an initiator, in this way prior to peeling is important. Owing to the preprocessing for selectively (partially) lowering the adhesion, peeling failure is avoided and the yield is improved.

A film 721 that is made of water-soluble resin is sealed on a second substrate 723 with a peelable adhesive medium 722 (a two-sided sheet). Further, a third substrate is sealed on the first substrate 700 with the peelable adhesive medium 722 (a two-sided sheet). (Not shown). The third substrate prevents the first substrate 700 from damaging in the later peeling process. A substrate having higher rigidity than that of the first substrate 700, such as a quartz substrate is preferably used for the second substrate 723 and the third substrate.

Figure 7E:
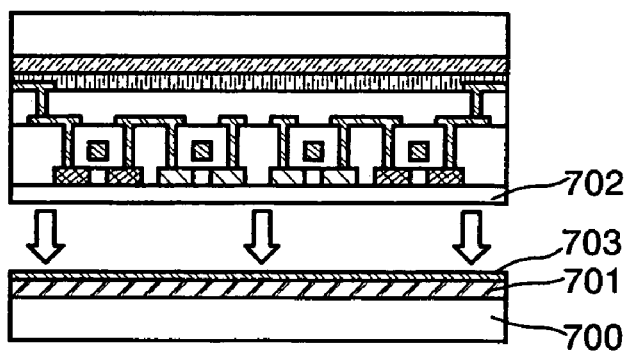

Next, the first substrate 700 over which the tungsten layer 701 is provided is peeled off from the side of the region where the adhesion is partially lowered by a physical means as shown in FIG. 7E. The first substrate can be peeled off with a relatively small force (for example, by human hands, pressure of gas sprayed through a nozzle, supersonic wave, or the like). In the present embodiment mode, separation is occurred between the silicon oxide layer and the tungstic oxide layer. As described above, an integrated circuit formed of a polysilicon film and formed over the silicon oxide layer 702 can be separated from the first substrate 700. In the case of tungstic oxide is left on the surface of the silicon oxide layer 702, the adhesion occasionally becomes worse. Thus, the tungstic oxide is to be removed by etching or the like so as to increase the adhesion to the first integrated circuit. Then, the second substrate 723 is separated to form a second integrated circuit.

Figure 8A:
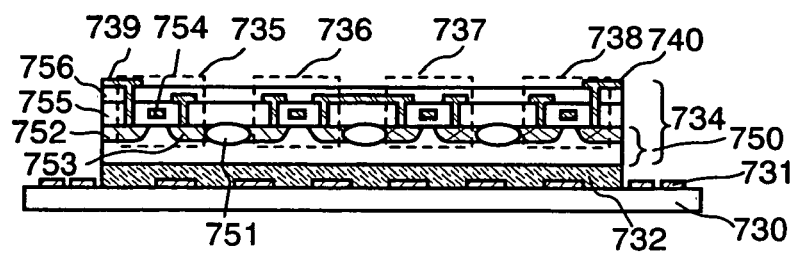
FIGS. 8A to 8D are diagrams showing Embodiment 1.

Then, as shown in FIG. 8A, after forming a wiring portion 731 over an insulating substrate 730, a first integrated circuit 734 formed of a single crystal silicon substrate is placed over the insulating substrate and the wiring portion by using an adhesive 732. A through-hole for connecting the wiring portion 731 and an exterior terminal such as a solder ball is formed on the insulating substrate 730.

The wiring portion is pattered with gold alloy by a photolithography method.

The first integrated circuit is formed by using a FET formed by a know technique. In the present embodiment mode, NMOSFETs 735 and 736 and PMOSFETs 737 and 738 are formed over a single crystal silicon substrate 750, and the complemented combination of the above MOSFET constitutes a CMOS circuit. In addition, NMOSFET 735 and 736, and PMOSFET 737 and 738 include source and drain regions 752 and 753, a gate electrode 754, and interlayer insulating films 755 and 756 (here, explanation is made by using NMOSFET 735 for an example). In the surface of the interlayer insulating film, wirings for connecting to the each FET are exposed to the surface of the substrate as an electrode pad (reference numeral 739 and 740 in FIG. 8A). The each FET is separated by the oxide film 751. The oxide film can be formed by using a selective oxidation method (also called a LOCOS method) or a trench separation method.

In the case where NMOSFET and PMOSFET are formed over the same semiconductor substrate, there is a need of providing a region (well) having a different conductivity from that of the substrate, methods thereof including: a P well system in which a P well is formed over a N type substrate, a N channel transistor is formed over the P well, and a P channel transistor is formed over the N type substrate; a N well system in which a N well is formed over a P type substrate, a P channel transistor is formed over the N well, and a N channel transistor is formed on the P type substrate; and the twin well system in which a N well and a P well are formed over a N type or P type substrate, a P channel transistor is formed over the N well, and a N channel transistor is formed over the P well.

Also, while a FET having one channel-forming region is shown here, it is not limited, and a FET may have a plurality of channels.

Figure 8B:
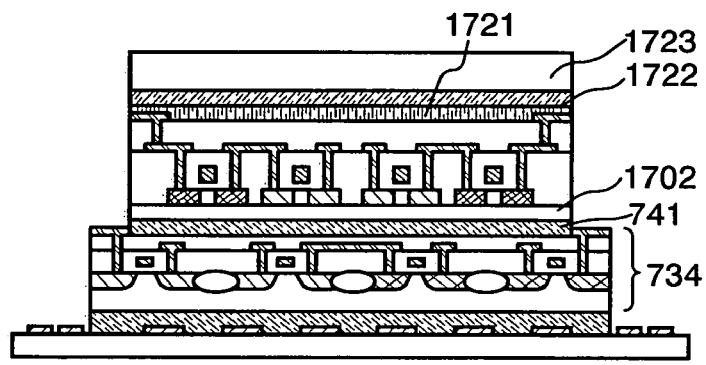

Next, as shown in FIG. 8B, a silicon oxide film 1702 forming a second integrated circuit by using an adhesive member 741 is bonded over a first integrated circuit 734 formed of a silicon substrate. It is noted that the second integrated circuit is a CMOS circuit formed over the silicon oxide film 1702, in which an electrode pad is formed. Further, the severed second substrate (hereinafter, referred to as a third substrate 1723) is fixed in the surface thereof with a soluble resin 1721 and a peelable adhesive medium 1722. It is important that the adhesive member 741 for bonding the silicon oxide 1702 and the first integrated circuit 734 has higher adhesion than the soluble resin 1721 and the peelable adhesive medium 1722 for bonding the third substrate 1723 and the second integrated circuit. In this embodiment mode, a bonding sheet is used for the adhesive member 741, and used for bonding while performing the alignment so as not to cover the electrode pads 739 and 740.

Figure 8C:
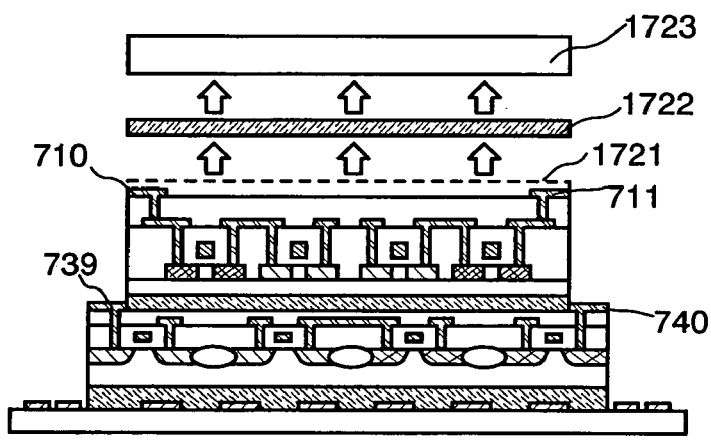

Then, as shown in FIG. 8C, the third substrate 1723 is separated form the adhesive peelable medium (two-sided tape) 1722, and the peelable adhesive medium (two-sided tape) 1722 is separated from the soluble resin 1721. Note that, the two-sided tape and the third substrate may be separated from the soluble resin at the same time.

The soluble resin 1721 is dissolved by using water and removed. The remained soluble resin causes a defective so that the surface of the electrodes pads 710 and 711 are preferably cleaned by $O_2$ plasma treatment.

Figure 8D:
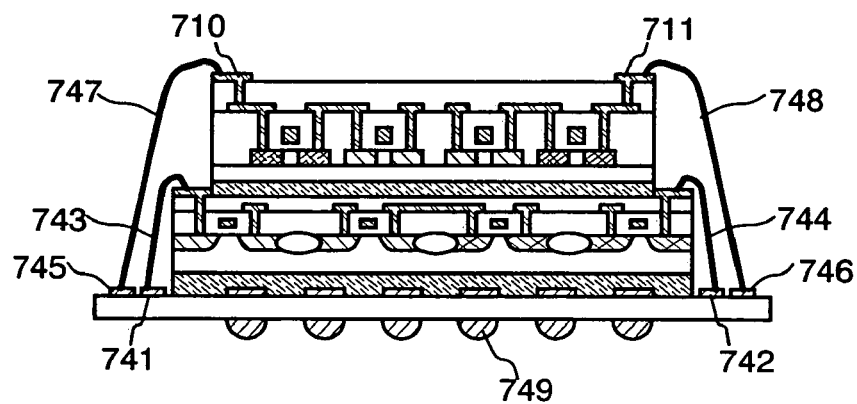

Further, as shown in FIG. 8D, the electrodes pads 739 and 740 on the first integrated circuit and the terminal of the wiring portions 741 and 742 are electrically connected each other by wirings 743 and 744 respectively, and the electrode pads 710 and 711 on the second integrated circuit and the terminal of wiring portion 745 and 746 are connected each other by wirings 747 and 748 respectively.

According to the above described processes, a semiconductor device in which a integrated circuit (a first integrated circuit) integrated by a single crystal silicon substrate 750 and a integrated circuit (a second integrated circuit) integrated by a polysilicon film are laminated can be manufactured.

[Embodiment 2]

Figure 3A:
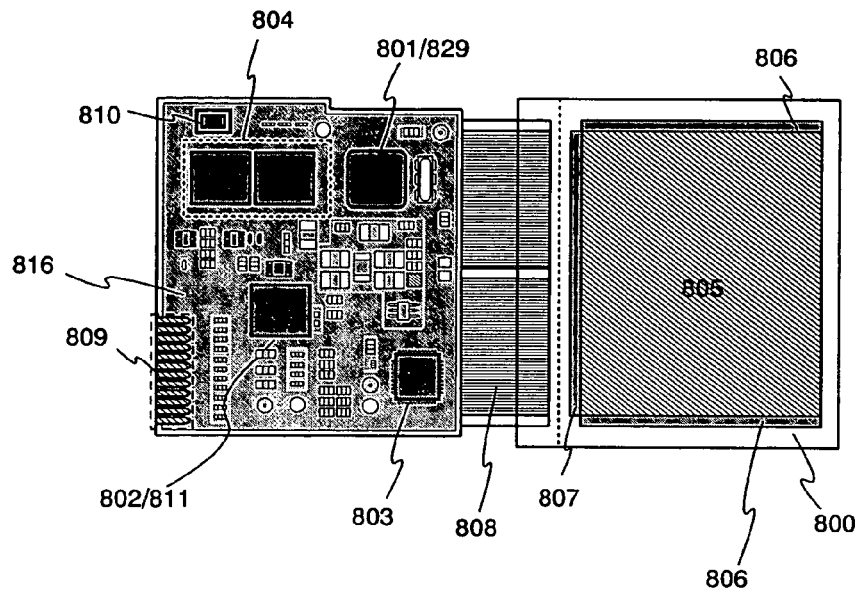
FIGS. 3A and 3B are a top view of a module of an electric apparatus and the block diagram using a semiconductor device of the present invention.

A cellular phone that is one of electric apparatuses in the present invention is taken as an example. FIG. 3A shows an appearance in which a package is practically equipped with the electric apparatus.

A module of the cellular phone shown in FIG. 3A includes a printed wiring board 816 over which a CPU 802 laminated on a memory 811 (regions 802/811 in FIG. 3A), a power supply circuit 803, a controller 801 laminated on a sound processing circuit 829 (regions 801/829 in FIG. 3A), a transmitter-receiver circuit 804, furthermore, elements such as a resistance, a buffer, and a capacity element are mounted. Moreover, a panel 800 is mounted over the printed wiring board 816 by a FPC 808. The panel 800 is provided with a pixel portion 805 equipped with a light emitting element in each pixel, a scanning line driver circuit 806 for selecting a pixel included in the pixel 805, a signal line driver circuit 807 for supplying a video signal to the selected pixel.

A supply voltage to the printed wiring board 816 and various signals inputted form a key board are provided through an interface (I/F) portion 809 of the printed wiring board in which plural input terminals are disposed. Also, a port for antenna 810 which transmits and receives signals between the printed wiring board and an antenna is provided for the printed wiring board 816.

In the present embodiment mode, the printed wiring board 816 is mounted over the panel 800 by using FPC 808. The structure is not limited thereto. A controller 801, a sound processing circuit 829, a memory 811, a CPU 802, or a power supply circuit 803 may be directly mounted over the panel 800 with a COG (Chip on Glass) method.

Further, in the printed wiring board 816, there is a case that capacity formed between leading wirings and a resistance of a wiring itself cause a noise to a supply voltage or a signal, or make a rise of a signal dull. However, the noise to the supply voltage or the signal and the dull rise of the signal in the printed wiring board 816 can be prevented by supplying various kinds of elements such as a capacitor element and a buffer to the printed wiring board.

Figure 3B:
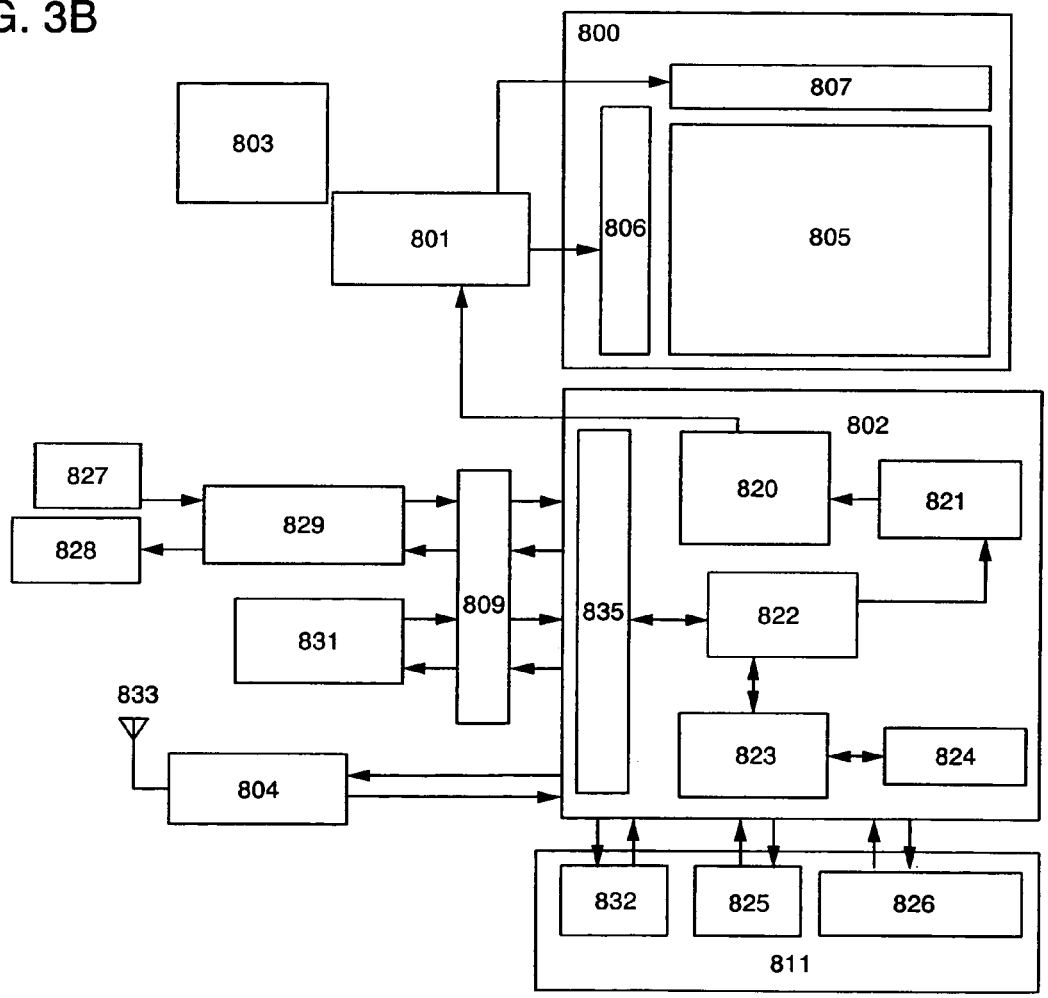

FIG. 3B shows a block diagram of the module shown in FIG. 3A.

In the present embodiment, a VRAM 832, a DRAM 825, a flash memory 826 are included as a memory 811. An image data for displaying in a panel in the VRAM 832 stores, a image or sound data is stored in the DRAM 825, and various kinds of programs are stored in the flash memory. An area to be mounted becomes increased according to the increase of the amount of the memory capacity. Therefore, a single crystal silicon wafer is preferably used to manufacture a memory.

In the power supply circuit 803, the panel 800, the controller 801, the CPU 802, the sound processing circuit 829, the memory 811, the supply voltage of the transmitter-receiver circuit 804 are generated. There is a case that a power source is provided for the power supply circuit 803 depending on the panel specification. The power supply circuit has a function for controlling an electric current to the stability which is to be supplied to the panel, the controller, the CPU, and the like A bipolar transistor capable of drawing lots of current is adapted to the elements, and therefore, the power supply circuit is preferably formed of a silicon wafer.

The CPU 802 comprises a controlling signal generating circuit 820, a decoder 821, a register 822, an arithmetic circuit 823, a RAM 824, a interface 835 for CPU and the like. Various kinds of signals inputted to the CPU 802 through the interface 835 are once kept in the resistor 822, then inputted to the arithmetic circuit 823, the decoder 821 and the like. In the arithmetic circuit 823, an operation is carried out in accordance with the signal inputted, and a region to be sent the each instrument is designated. Alternatively, the signal inputted to the decoder 821 is decoded, and inputted to the controlling signal generating circuit 820. A signal containing various instructions is generated in the controlling signal generating circuit 820 based on the signal inputted, and sent to the place designated by the arithmetic circuit 823, in concrete terms, to the memory 811, the transmitter-receiver circuit 804, the sound processing circuit 829, the controller 801, or the like. The CPU is manufactured by a TFT using the polysilicon as an active region; therefore a thin CPU can be obtained.

The memory 811, the transmitter-receiver circuit 804, the sound processing circuit 829, and the controller 801 perform each operation by an instruction. Each the operation will be described hereinafter.

The signal inputted from a keyboard 831 is transmitted into the CPU 802 mounted over the printed wiring board 816 through the interface 809. In the controlling signal generating circuit 820, an image date stored in the VRAM 832 is converted into a prescribed format in accordance with the signal transmitted from a keyboard 831 and sent to the controller 801.

The signal including the image data sent from the CPU 802 is data-processed in accordance with the panel specification in the controller 801, and supplied to the panel 800. In addition, the controller 801 generates a Hsync signal, a Vsync signal, a clock signal CLK, and a volts alternating current (AC Cont) in accordance with a supply voltage inputted from the power supply circuit 803 or various signals inputted from CPU, and supplies theses signals to the panel 800. The controller can be manufactured by a TFT using the polysilicon in the active region.

In the transmitter-receiver circuit 804, a signal which is transmitted and received as an electric wave is processed in an antenna 833, specifically, a high frequency circuit such as an isolator, a band pass filter, a VCO (Voltage Controlled Oscillator), an LPF (Low Pass Filter), a coupler, and a balun are included. A signal including sound information among signals transmitted and received is transmitted to the sound processing circuit 829 by an instruction of the CPU 802. The transmitter-receiver circuit is manufactured by a GaAs semiconductor substrate or a silicon wafer because of including a high frequency circuit.

A signal including sound information sent by the instruction of the CPU 802 is demodulated into a sound signal in the sound processing circuit 829, and sent to a speaker 828. A sound signal send from a mike 827 is modulated in the sound processing circuit 829, and sent to the transmitter-receiver circuit 804 by an instruction of the CPU 802. The sound processing circuit is formed of an amplifier and a converter. The variation on the characteristic of an amplifier becomes significant to the audio quality outputted from the speaker, thus, the amplifier is preferably formed of silicon wafer with few variation. Alternatively, the converter can be manufactured by a TFT formed of polysilicon, consequently, a thin converter can be obtained.

The semiconductor device manufactured in Embodiment 1 can be adapted to the CPU 802 (regions 802/811 in FIG. 3A) laminated over the memory 811 and the controller 801 (regions 801/829 in FIG. 3A) laminated over the sound processing circuit 829. Note that a semiconductor device having a structure above described is shown in the present embodiment, the combination of the structure is not limited thereto. It can be a laminated structure in which a circuit capable of manufactured of a TFT(a controller 801, a CPU 802, a converter of a sound processing circuit 829, a scanning line driver circuit 806 for selecting a pixel in a pixel portion, or a signal line driver circuit 807 for supplying a video signal to the selected pixel) is optionally provided for a circuit preferably manufactured by a semiconductor substrate such as a silicon wafer (typically, a power supply circuit 803, a transmitter-receiver circuit 804, a memory 811, an amplifier of a sound processing circuit 829).

A semiconductor device manufactured according to the present invention is the one laminated semiconductor elements in which a integrated circuit is formed, and a part of the semiconductor element is formed of a semiconductor thin film, therefor, characteristics of a highly integrated and small volume semiconductor device is revealed.

Further, the number of semiconductor elements in which an integrated circuit is formed by using semiconductor substrates per semiconductor device, typically, the number of single crystal silicon ICs can be reduced. Thus, mass production of semiconductor devices with lower cost and higher throughput can be realized as compared with the conventional MCP, and production cost per semiconductor device can be reduced.

Moreover, smaller volume (namely, small volume and low height) and more sophisticated (typically, the increase in the amount of memory, or the like) semiconductor device can be manufactured by adapting an element in which an integrated circuit is formed by using a semiconductor substrate to a power supply circuit, a transmitter-receiver circuit, a memory, a high frequency circuit such as a amplifier of a sound processing circuit, a highly integrated circuit, or a high capacity circuit, and also adapting a semiconductor element in which an integrated circuit is formed by a semiconductor thin film to a circuit capable of being formed by a TFT such as a controller, a CPU, a converter of an sound processing circuit, a scanning line driver circuit for selecting pixel in a pixel portion, a signal line driver circuit for supplying a video signal to the selected circuit. Then, more semiconductor devices can be mounted in the limited volume of an electric apparatus, and a small sized and lightweight electric apparatus can be obtained while realizing multifunction of the electric apparatus. Specially, in the case of the portable electric apparatus, it is important to be small sized and lightweight, therefore, a semiconductor device of the present invention can be effectively used.

What is claimed is:

1. A method for manufacturing a semiconductor device in which a wiring portion, a first semiconductor element, and a second semiconductor element are laminated on an insulating substrate in sequence, comprising the steps of:
    forming an integrated circuit of the first semiconductor element using a semiconductor substrate;
    bonding the first semiconductor element to the insulating substrate through the wiring portion;
    laminating a metal film, a metal oxide film, an insulating film, and a semiconductor thin film on a surface of a first substrate in sequence;
    crystallizing the metal oxide film and the semiconductor thin film by a heat treatment;
    forming an integrated circuit of the second semiconductor element using the crystallized semiconductor thin film;
    bonding a second substrate over the second semiconductor element with a first adhesive member so as to face the first substrate;
    separating the first substrate from the second semiconductor element;
    bonding the second semiconductor element over the first semiconductor element;
    separating the second substrate from the second semiconductor element; and
    electrically connecting the second semiconductor element to the wiring portion after electrically connecting the first semiconductor element to the wiring portion.

2. A method for manufacturing a semiconductor device according to claim 1, wherein the semiconductor substrate is at least one of a single crystal silicon substrate and a compound semiconductor substrate.

3. A method for manufacturing a semiconductor device according to claim 1, wherein the semiconductor substrate is at least one selected from the group consisting of a n-type or a p-type single crystal silicon substrate, a GaAs substrate, an InP substrate, a GaN substrate, a SiC substrate, a ZnSe substrate, a GaP substrate, and an InSb substrate.

4. A method for manufacturing a semiconductor device according to claim 1, wherein the semiconductor thin film comprises silicon.

5. A method for manufacturing a semiconductor device according to claim 1, wherein the first semiconductor element comprises at least one selected from the group consisting of a power supply circuit, a transmitter-receiver circuit, a memory, and an amplifier of a sound processing circuit.

6. A method for manufacturing a semiconductor device according to claim 1, wherein the second semiconductor element comprises at least one selected from the group consisting of a scanning line driver circuit of a pixel portion, a signal line driver circuit, a controller, a CPU, and a converter of a sound processing circuit.

7. A method for manufacturing a semiconductor device according to claim 1, wherein the first adhesive member comprises a peelable adhesive.

8. A method for manufacturing a semiconductor device according to claim 1, wherein the insulating substrate comprises a material selected from the group consisting of polyimide, alumina, ceramics, or glass epoxy resin.

9. A method for manufacturing a semiconductor device according to claim 1, wherein the step of separating the first substrate from the second semiconductor element is conducted by a physical means.

10. A method for manufacturing a semiconductor device according to claim 1, wherein the step of separating the first substrate from the second semiconductor element is conducted by separating the metal film from the crystallized metal oxide film.

11. A method for manufacturing a semiconductor device according to claim 1, wherein the step of separating the first substrate from the second semiconductor element is conducted by separating the crystallized metal oxide film from the insulating film.

12. A method for manufacturing a semiconductor device according to claim 1, wherein the step of separating the second substrate from the second semiconductor element is conducted after removing the first adhesive member.

13. A method for manufacturing a semiconductor device comprising:
    forming a first semiconductor element on a semiconductor substrate;
    bonding the first semiconductor element to an insulating substrate with a first adhesive layer interposed therebetween, wherein the insulating substrate has a first wiring portion and a second wiring portion;
    forming a second semiconductor element comprising a plurality of thin film transistors;
    bonding the second semiconductor element over the first semiconductor element with a second adhesive layer interposed therebetween; and
    electrically connecting the first semiconductor element to the first wiring portion and electrically connecting the second semiconductor element to the second wiring portion.

14. A method for manufacturing a semiconductor device comprising:
    forming a first semiconductor element on a semiconductor substrate;
    bonding the first semiconductor element to an insulating substrate with a first adhesive layer interposed therebetween, wherein the insulating substrate has a first wiring portion and a second wiring portion;
    forming a second semiconductor element comprising a plurality of thin film transistors over a substrate;
    separating the second semiconductor element from the substrate;
    bonding the second semiconductor element over the first semiconductor element with a second adhesive layer interposed therebetween; and
    electrically connecting the first semiconductor element to the first wiring portion and electrically connecting the second semiconductor element to the second wiring portion.

15. A method for manufacturing a semiconductor device comprising:
    forming a first semiconductor element on a semiconductor substrate;
    bonding the first semiconductor element to an insulating substrate with a first adhesive layer interposed therebetween, wherein the insulating substrate has a first wiring portion and a second wiring portion;
    forming a second semiconductor element comprising a plurality of thin film transistors;
    bonding the second semiconductor element over the first semiconductor element with a second adhesive layer interposed therebetween; and
    electrically connecting the second semiconductor element to the second wiring portion after electrically connecting the first semiconductor element to the first wiring portion.

16. A method for manufacturing a semiconductor device comprising:
    forming a first semiconductor element on a semiconductor substrate;
    bonding the first semiconductor element to an insulating substrate with a first adhesive layer interposed therebetween, wherein the insulating substrate has a first wiring portion and a second wiring portion;
    forming a second semiconductor element comprising a plurality of thin film transistors over a substrate;
    separating the second semiconductor element from the substrate;
    bonding the second semiconductor element over the first semiconductor element with a second adhesive layer interposed therebetween; and
    electrically connecting the second semiconductor element to the second wiring portion after electrically connecting the first semiconductor element to the first wiring portion.

17. A method for manufacturing a semiconductor device according to any one of claims 13 to 16, wherein the semiconductor substrate is at least one of a single crystal silicon substrate and a compound semiconductor substrate.

18. A method for manufacturing a semiconductor device according to any one of claims 13 to 16, wherein the semiconductor substrate is at least one selected from the group consisting of a n-type or a p-type single crystal silicon substrate, a GaAs substrate, an InP substrate, a GaN substrate, a SiC substrate, a ZnSe substrate, a GaP substrate, and an InSb substrate.

19. A method for manufacturing a semiconductor device according to any one of claims 13 to 16, wherein the first semiconductor element comprises at least one selected from the group consisting of a power supply circuit, a transmitter-receiver circuit, a memory, and an amplifier of a sound processing circuit.

20. A method for manufacturing a semiconductor device according to any one of claims 13 to 16, wherein the second semiconductor element comprises at least one selected from the group consisting of a scanning line driver circuit of a pixel portion, a signal line driver circuit, a controller, a CPU, and a converter of a sound processing circuit.

21. A method for manufacturing a semiconductor device according to any one of claims 13 to 16, wherein the insulating substrate comprises a material selected from the group consisting of polyimide, alumina, ceramics, or glass epoxy resin.

22. A method for manufacturing a semiconductor device according to any one of claims 14 and 16, wherein the separating step is conducted, by a physical means.

* * * * *